US008030824B2

(12) United States Patent
Knowles et al.

(10) Patent No.: US 8,030,824 B2

(45) Date of Patent: Oct. 4, 2011

(54) WIDE BANDWIDTH MATRIX TRANSDUCER WITH POLYETHYLENE THIRD MATCHING LAYER

(75) Inventors: Heather Knowles, Devens, MA (US); William Ossmann, Acton, MA (US); Martha Wilson, Andover, MA (US)

(73) Assignee: Koninklijke Philips Electronics N.V., Eindhoven (NL)

(*) Notice: Subject to any disclaimer, the term of this patent is extended or adjusted under 35 U.S.C. 154(b) by 835 days.

(21) Appl. No.: 12/063,294

(22) PCT Filed: Jul. 19, 2006

(86) PCT No.: PCT/IB2006/052476

§ 371 (c)(1),
(2), (4) Date: Feb. 8, 2008

(87) PCT Pub. No.: WO2007/017776

PCT Pub. Date: Feb. 15, 2007

(65) Prior Publication Data

US 2010/0168581 A1 Jul. 1, 2010

Related U.S. Application Data

(60) Provisional application No. 60/706,399, filed on Aug. 8, 2005.

(51) Int. Cl.
*H01L 41/083* (2006.01)

(52) U.S. Cl. ........................................ 310/334; 310/335

(58) Field of Classification Search .................. 310/334, 310/335, 311; 600/437; 367/155, 157; 29/25.35; *H01L 41/083*

See application file for complete search history.

(56) References Cited

U.S. PATENT DOCUMENTS

| | | | | |
|---|---|---|---|---|
| 2,949,910 | A * | 8/1960 | Brown et al. | 310/334 |
| 4,166,967 | A * | 9/1979 | Benes et al. | 310/334 |
| 6,396,199 | B1 * | 5/2002 | Douglas et al. | 310/335 |
| 6,551,247 | B2 | 4/2003 | Saito | |
| 6,666,825 | B2 * | 12/2003 | Smith et al. | 600/459 |
| 2004/0049901 | A1 | 3/2004 | Nguyen | |
| 2005/0165313 | A1 * | 7/2005 | Byron et al. | 600/459 |

FOREIGN PATENT DOCUMENTS

| | | | |
|---|---|---|---|
| EP | 1132149 | A2 | 9/2001 |
| EP | 1542005 | A1 | 6/2005 |
| EP | 1642531 | A1 | 4/2006 |

* cited by examiner

*Primary Examiner* — Walter Benson
*Assistant Examiner* — Karen B Addison
(74) *Attorney, Agent, or Firm* — W. Brinton Yorks, Jr.

(57) ABSTRACT

A third matching layer (140) affording wide bandwidth for an ultrasound matrix probe is made of polyethylene, and may extend downwardly to surround the array (S360) and attach to the housing to seal the array (S370).

16 Claims, 3 Drawing Sheets

WIDE BANDWIDTH MATRIX TRANSDUCER WITH POLYETHYLENE THIRD MATCHING LAYER

An ultrasound transducer serves to convert electrical signals into ultrasonic energy and to convert ultrasonic energy back into electrical signals. The ultrasonic energy may be used, for example, to interrogate a body of interest and the echoes received from the body by the transducer may be used to obtain diagnostic information. One particular application is in medical imaging wherein the echoes are used to form two and three dimensional images of the internal organs of a patient. Ultrasound transducers use a matching layer or a series of matching layers to more effectively couple the acoustic energy produced in the piezoelectric to the body of the subject or patient. The matching layers lie above the transducer, in proximity of the body being probed. Acoustic coupling is accomplished, layer-by-layer, in a manner analogous to the functioning of respective anti-reflection coatings for lenses in an optical path. The relatively high acoustic impedance of the piezoelectric material in a transducer in comparison to that of the body is spanned by the intervening impedances of the matching layers. A design might, for example, call for a first matching layer of particular impedance. The first matching layer is the first layer encountered by the sound path from the transducer to the body. Each successive matching layer, if any, requires progressively lower impedance. The impedance of the topmost layer is still higher than that of the body, but the one or more layers provide a smoother transition, impedance-wise, in acoustically coupling the ultrasound generated by the piezoelectric to the body and in coupling the ultrasound returning from the body to the piezoelectric.

Optimal layering involves a design of an appropriate series of acoustic impedances and the identification of respective materials. Materials used in the matching layers of one-dimensional (1D) transducers whose elements are aligned in a single row include ceramics, graphite composites, polyurethane, etc.

Although 1D transducers have been known to include a number of matching layers, transducers configured with a two-dimensional (2D) array of transducer elements require a different matching layer scheme due to the different shape of the transducer elements. A traveling sound wave oscillates at a frequency characteristic of that particular sound wave, and the frequency has an associated wavelength. The elements of 1D array transducers are typically less than half a wavelength wide of the operating frequency in one transverse direction, but several wavelengths long in the other transverse direction. Elements of a 2D array transducer may be less than half a wavelength wide in both transverse directions. This change of shape reduces the effective longitudinal stiffness, and therefore, the mechanical impedance of the element. Since the element impedance is lower, it follows that the impedances of the matching layers also should be lower to achieve the best performance. A complicating factor of low impedance materials, however, is that when cut into narrow posts as in a 2D array transducer, the speed of sound becomes dependent on the frequency of the signal, a phenomenon known as velocity dispersion. This dispersion changes the matching properties of the layer with frequency, which is undesirable, and can create a cutoff frequency above which it is not possible to operate the transducer. 2D array transducers are currently built with only two matching layers, due to the lack of suitable materials for a three matching layer design. However, this limits the bandwidth and sensitivity, both of which are critical to improving performance in Doppler, color flow, and harmonic imaging modes. In the case of harmonic imaging, for example, a low fundamental frequency is transmitted to provide deeper penetration into the body tissue of the ultrasound subject or patient, but higher resolution is obtained by receiving harmonic frequencies above the fundamental. A bandwidth large enough to include diverse frequencies is therefore often desirable.

The piezoelectric elements of 1D and 2D array transducers typically have been made of polycrystalline ceramic materials, one of the most common being lead zirconate titanate (PZT). Single-crystal piezoelectric materials are becoming available, e.g., mono-crystalline lead manganese niobate/lead titanate (PMN/PT) alloys. Piezoelectric transducer elements made from these monocrystalline materials, exhibit significantly higher electro-mechanical coupling which potentially affords improved sensitivity and bandwidth.

The present inventors observe that the increased electro-mechanical coupling of single-crystal piezoelectrics also produces a lower effective acoustic impedance. As a result, it is preferable to select matching layers of acoustic impedance lower than those for a typical poly-crystalline transducer such as a ceramic one.

Since the three matching layer, mono-crystalline transducer requires matching layers with lower acoustic impedances, and since the second matching layer of an ultrasound probe transducer is always of lower impedance than its first matching layer, it is possible that a second matching layer usable for ceramic transducers, such as graphite composite, may serve as a first matching layer for a three matching layer, mono-crystalline transducer.

The first and second matching layers typically are stiff enough that the layers for each element of the array must be separated from each other mechanically to keep each element acoustically independent of the others. Most often, this is done by means of saw cuts in two directions that penetrate the two matching layers and the piezoelectric material.

Another consideration may be electrical conductivity, which would not present a problem for isotropically conductive graphite composite.

Finding a suitable second matching layer, however, may involve selecting a material with not only the proper acoustic impedance, but appropriate electrical conductivity.

A piezoelectric transducer of an ultrasound probe relies upon electric fields produced in the piezoelectric. These fields are produced and detected by means of electrodes attached to at least two faces of the piezoelectric To generate ultrasound, for example, a voltage is applied between the electrodes requiring electrical connections to be made to the electrodes. Each element of the transducer might receive a different electrical input. Terminals to the transducer elements are sometimes attached perpendicularly to the sound path, although this can be problematic for internal elements of two-dimensional matrix arrays. Accordingly, it may be preferable to attach the elements to a common ground on top of, or under, the array. A matching layer may serve as a ground plane, or a separate ground plane may be provided. The ground plane may be implemented with an electrically-conductive foil thin enough to avoid perturbing the ultrasound.

However, unless the separate ground plane is disposed between the first matching layer and the piezoelectric element, the first matching layer is preferably made electrically-conductive in the sound path direction in order to complete an electrical circuit that flows from behind and through the array. Because the 2D array elements are mechanically separated, e.g. by saw cuts in two directions producing individual posts, there is no electrical path for an element in the interior of the array laterally to the edge of the array. Accordingly, the electrical path must be completed through the matching layer. The same principle holds for the second matching layer.

Polyurethane, with an acoustic impedance of around 2.1 MegaRayls (MRayls), might serve as a third matching layer, which requires the lower impedance than the first or second layers. However, besides having an impedance somewhat higher than that desired, polyurethane is very susceptible to chemical reaction. Accordingly, polyurethane requires a protective coating to seal the polyurethane and the rest of the transducer array from environmental contamination as from chemical disinfecting agents and humidity. Moreover, from a process control perspective, different production runs may yield different thicknesses of the protective coating, leading to uneven acoustic performance among produced probes. Finally, the need for a separate process to apply the protective coating increases production cost enormously.

To overcome the above-noted shortcomings, an ultrasound transducer, in one aspect, includes a piezoelectric element, and first through third matching layers, the third layer comprising low-density polyethylene (LDPE).

In another aspect, an ultrasound transducer has an array of transducer elements arranged in a two-dimensional configuration and at least three matching layers.

Details of the novel ultrasound probe are set forth below with the aid of the following drawings, wherein.

Figure 1:
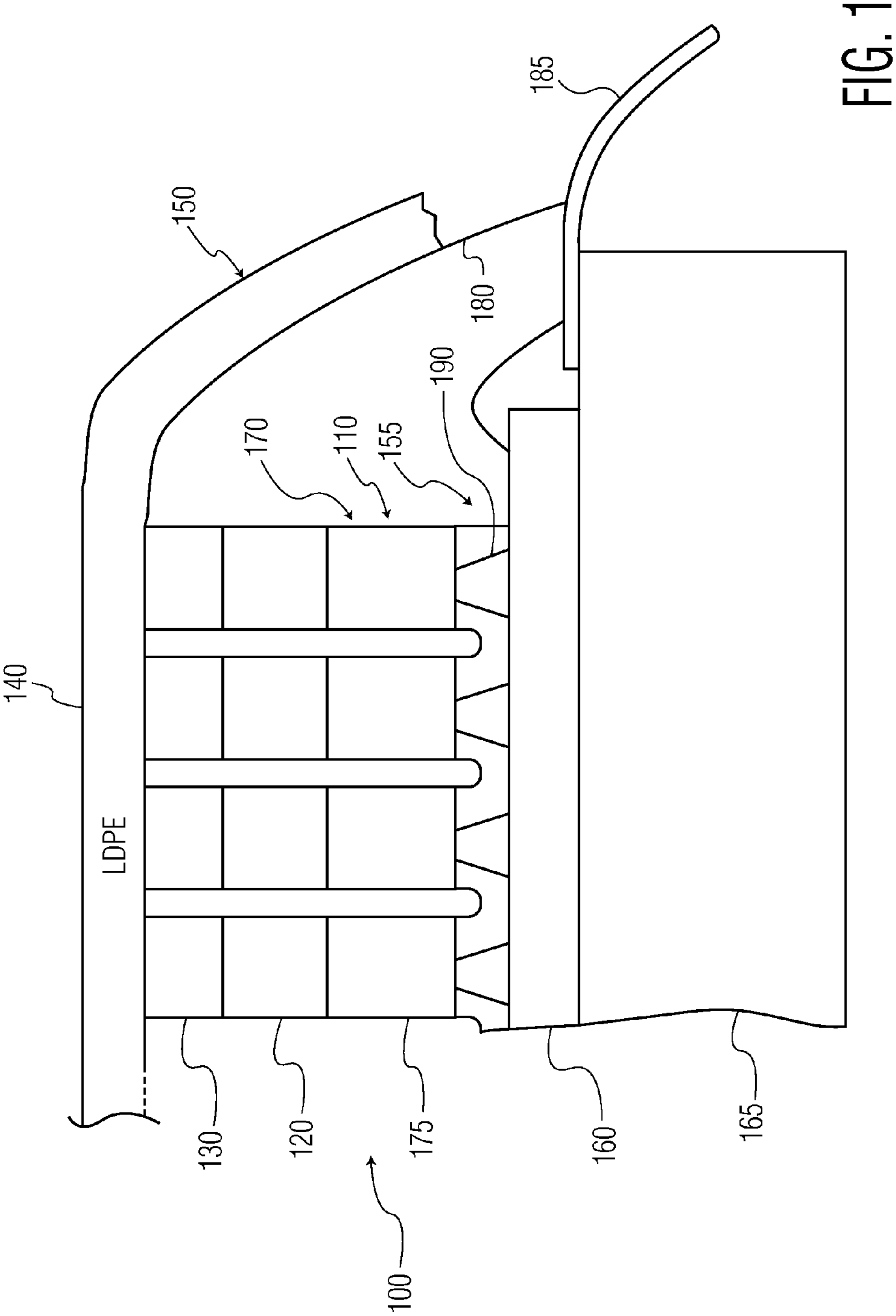
FIG. 1 is a side cross-sectional view of a matrix transducer having three matching layers, according to the present invention.

FIG. 1 shows, by way of illustrative and non-limitative example, a matrix transducer 100 usable in an ultrasound probe according to the present invention. The matrix transducer 100 has a piezoelectric layer 110, three matching layers 120, 130, 140, a film 150 that incorporates the third matching layer 140, an interconnect layer 155, one or more semiconductor chips (ICs) 160 and a backing 165. The piezoelectric layer 110 is comprised of a two-dimensional array 170 of transducer elements 175, rows being parallel to, and columns of the array being perpendicular to the drawing sheet for FIG. 1. The transducer 100 further includes a common ground plane 180 between the second and third matching layers 130, 140 that extends peripherally to wrap around downwardly for attachment to a flexible circuit 185, thereby completing circuits for individual transducer elements 175. Specifically, the transducer element 175 is joined to a semiconductor chip 160 by stud bumps 190 or other means, and the chip is connected to the flexible circuit 185. A coaxial cable (not shown) coming from the back of the ultrasound probe typically is joined to the flexible circuit 185. The matrix transducer 100 may be utilized for transmitting ultrasound and/or receiving ultrasound.

The first matching layer 120, as mentioned above, may be implemented as a graphite composite.

Epoxy matching layers transmit sound with sufficient speed, and have density, and therefore acoustic impedance, that is sufficiently low for implementation as a second matching layer of a three-layer matrix transducer; however, epoxy layers are electrically non-conductive.

The second matching layer 130 may, for example, be a polymer loaded with electrically-conductive particles.

The third matching layer 140 is preferably made of low-density polyethylene (LDPE) and is part of the LDPE film 150 that extends downwardly in a manner similar to that of the common ground plane 180.

Figure 2:
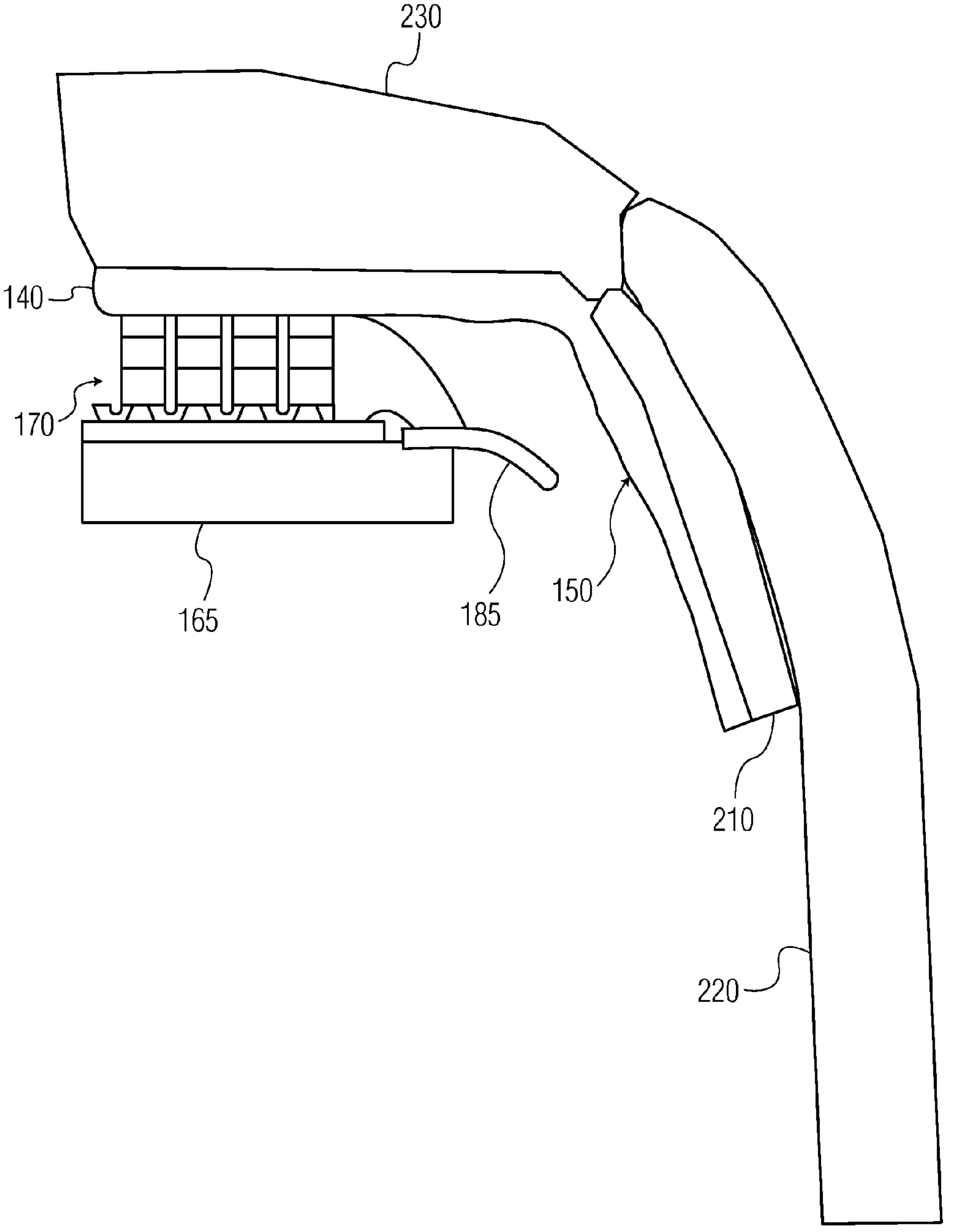
FIG. 2 is side cross-sectional view of an example of how the third matching layer is bonded to the transducer housing.

As seen in FIG. 2, however, instead of attaching to the flexible circuit 185, the third matching layer 140 in the embodiment shown in FIG. 1 attaches, by way of an epoxy bond 210, to a housing 220 of the transducer 100 to form a hermetic seal around the array 170. The epoxy bond 210 also may be used between the transducer housing 220 and an acoustic lens 230 overriding the third matching layer 140.

Figure 3:
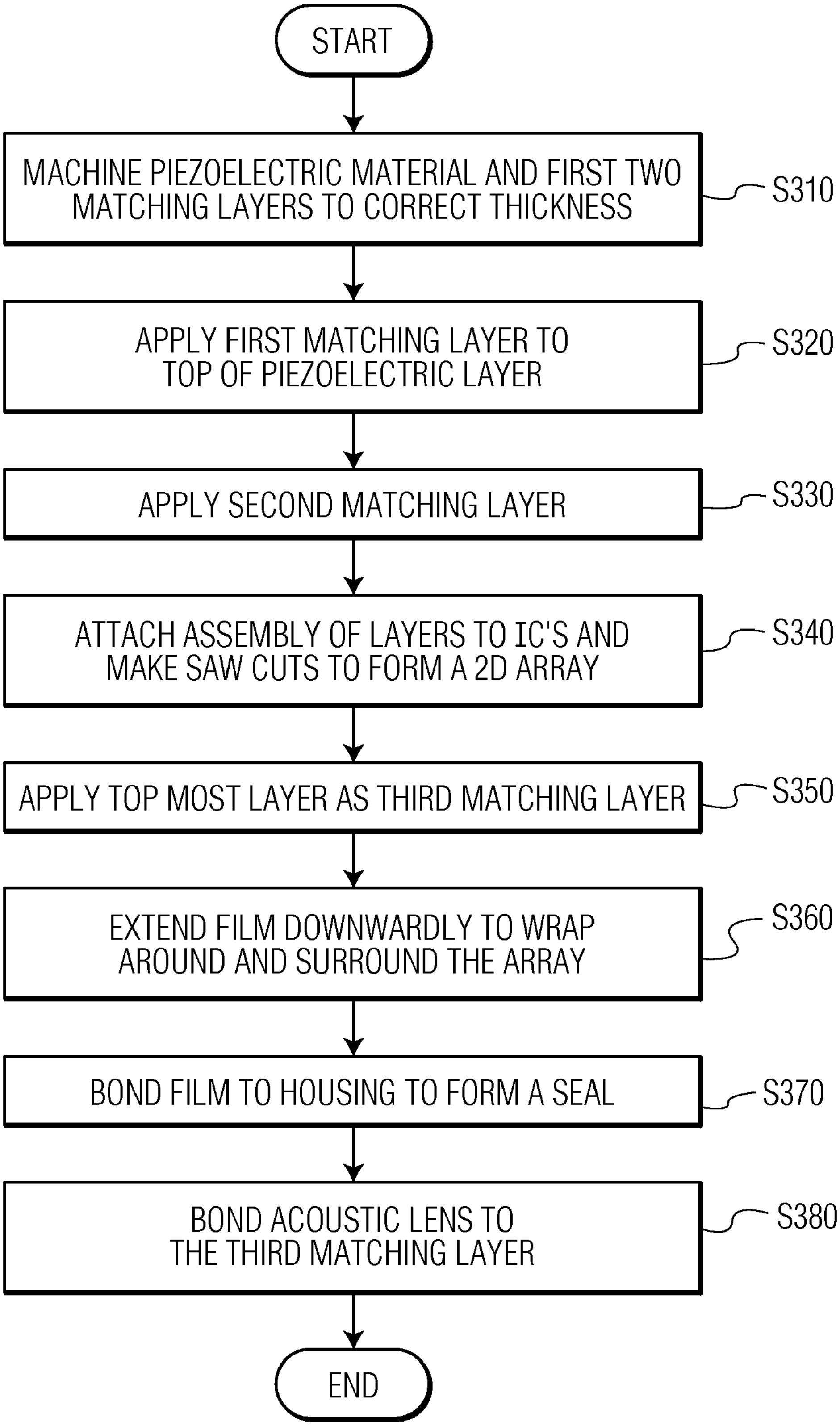
FIG. 3 is a flow chart of one example of a process for making the transducer of FIG. 1.

FIG. 3 sets forth one example of a process for making the probe 100 of FIG. 1 so as to include LDPE film 110 embodying the third matching layer 140. To construct the array 170, piezoelectric material and the first two matching layers 120, 130 are machined to the correct thicknesses and electrodes are applied to the piezoelectric layer 110 (step S310). After the first matching layer 120 is applied on top of the piezoelectric layer 110 (step S320), the second matching layer is applied (step S330). This assembly of layers 110, 120, 130 may be attached directly to the integrated circuits 160, if present, or to intermediary connecting means, e.g. the flexible circuit 185 or a backing structure with embedded conductors. The transducer 100 then is separated into a 2D array 170 of individual elements 175 by making multiple saw cuts in two orthogonal directions (step S340). Following the sawing operation, the ground plane 180 is bonded to the top of the second matching layer 130 and wrapped down around the array 170 to make contact with the flexible circuit 185 or other connecting means. The LDPE film 110 is applied on top and wrapped around to extend downwardly thereby surrounding the array 170. Part of the film 150 accordingly forms the topmost matching layer, which here is the third matching layer 140 (steps S350, S360). To form a hermetic seal around the array 170, the downwardly extended film 150 is bonded, as by epoxy 210, to the housing 220 (step S370). Thus, the LDPE also serves as a barrier layer. An additional step bonds the acoustic lens 230, typically a room temperature vulcanization (RTV) silicone rubber, to the third matching layer 140 (step S380). As compared to polyurethane, use of polyethylene as the third matching layer 140 eliminates the need for a protective coating, thereby cutting production cost dramatically.

Although a particular order of the steps in FIG. 3 is shown, the intended scope of the invention is not limited to this order. Thus, for example, the first and second matching layers 120, 130 may be bonded together before being applied as a unit to the piezoelectric material 110. Additionally, the acoustic design may call for one or more acoustic layers behind the piezoelectric layer 110.

In an alternative embodiment of the present invention, the acoustic lens 230 is replaced with a window, i.e., an element with no focusing acoustical power. The window may be made of the window material PEBAX, for instance. Normally, a PEBAX window would need not only a protective layer for the polyurethane third matching layer, but, in addition, an intervening bonding layer made, for example of a polyester material such as Mylar, to bond the protective layer to the PEBAX. However, LDPE can bond directly to the PEBAX; accordingly, neither a protective layer nor a bonding layer is needed. The double layer of PEBAX window material and LDPE film 150 can be made before attaching it to the second matching layer 130 connected to the array 170 by the first matching layer 120. The resulting transducer 100 with PEBAX window is usable not only for trans-esophageal echocardiography (TEE), but for other applications such as an intra-cardiac-echocardiography (ICE). Optionally, to meet size constraints, the LDPE could be cut to size and not wrapped.

The inventive matching layers may be incorporated into other types of probes such as pediatric probes, and onto various types of arrays such as curved linear and vascular arrays.

Although above embodiments are described with three matching layers, additional matching layers may intervene, as between the second and topmost matching layers 130, 140.

While there have shown and described and pointed out fundamental novel features of the invention as applied to preferred embodiments thereof, it will be understood that various omissions and substitutions and changes in the form and details of the devices illustrated, and in their operation, may be made by those skilled in the art without departing from the spirit of the invention. For example, it is expressly intended that all combinations of those elements and/or method steps which perform substantially the same function in substantially the same way to achieve the same results are within the scope of the invention. Moreover, it should be recognized that structures and/or elements and/or method steps shown and/or described in connection with any disclosed form or embodiment of the invention may be incorporated in any other disclosed or described or suggested form or embodiment as a general matter of design choice. It is the intention, therefore, to be limited only as indicated by the scope of the claims appended hereto.

The invention claimed is:

1. An ultrasound transducer comprising:

an array of piezoelectric elements, each having a relatively high acoustic impedance;

first and second matching layers attached to the piezoelectric elements, each having an acoustic impedance lower than the acoustic impedance of the piezoelectric elements; and a third matching layer attached to the second matching layer and comprising low-density polyethylene (LDPE) having an acoustic impedance lower than that of the second matching layer.

2. The transducer of claim 1, wherein the third matching layer further comprises:

an LDPE film that includes said third matching layer and extends downwardly to surround said elements.

3. The transducer of claim 2, wherein said film forms part of a seal around said elements.

4. The transducer of claim 1 wherein the array of piezoelectric elements further comprise:

an array of transducer elements arranged in a two-dimensional configuration.

5. The transducer of claim 1, wherein the first and second matching layers are electrically conductive, and further comprising:

a common ground plane located between the second and third matching layers.

6. The transducer of claim 5, wherein the common bond plane is wrapped around the array and makes contact with an electrical circuit.

7. The transducer of claim 5, wherein the electrical circuit further comprises a flexible circuit.

8. The transducer of claim 7, further comprising an integrated circuit, wherein the array of piezoelectric elements is attached to the integrated circuit; and wherein the flexible circuit is connected to the integrated circuit.

9. The method of claim 8, wherein furnishing further comprises furnishing electrically conductive first and second matching layers; and further comprising:

bonding a common ground plane between the second and third matching layers.

10. The method of claim 9, further comprising contacting the common ground plane with an electrical circuit.

11. The method of claim 10, wherein contacting further comprises contacting the common ground plane with a flexible circuit.

12. The method of claim 11, further comprising:

attaching the array of piezoelectric elements to an integrated circuit; and connecting the flexible circuit to the integrated circuit.

13. A method of making an ultrasound transducer comprising:

providing an array of piezoelectric elements, each having a relatively high acoustic impedance; and furnishing the elements with three matching layers, each of a lower acoustic impedance than that of the piezoelectric elements, the third of the matching layers comprising low-density polyethylene (LDPE) and being separated from the piezoelectric elements by first and second matching layers.

14. The method of claim 8, wherein the furnishing furnishes a film that includes said third matching layer and extends downwardly to surround said elements.

15. The method of claim 14, wherein said film forms part of a seal around said elements.

16. The method of claim 13, wherein providing further comprises:

providing an array of transducer elements arranged in a two-dimensional configuration.

* * * * *